(12) United States Patent
Liu et al.

(10) Patent No.: US 7,541,737 B2
(45) Date of Patent: Jun. 2, 2009

(54) ORGANIC ELECTROLUMINESCENT DEVICE AND DISPLAY INCORPORATING THE SAME

(75) Inventors: Tswen-Hsin Liu, Jhudong Township, Hsinchu County (TW); Chung-Chun Lee, Lunbei Township, Yunlin County (TW)

(73) Assignee: Au Optronics Corp., Hsin-Chu (TW)

( * ) Notice: Subject to any disclaimer, the term of this patent is extended or adjusted under 35 U.S.C. 154(b) by 555 days.

(21) Appl. No.: 11/326,876

(22) Filed: Jan. 6, 2006

(65) Prior Publication Data
US 2007/0035235 A1 Feb. 15, 2007

(30) Foreign Application Priority Data
Aug. 10, 2005 (TW) .............................. 94127223 A

(51) Int. Cl.
*H01L 51/30* (2006.01)
(52) U.S. Cl. .................. 313/504; 313/506; 428/690; 428/917
(58) Field of Classification Search ................ 313/506, 313/504; 428/690, 917
See application file for complete search history.

(56) References Cited

U.S. PATENT DOCUMENTS

| 4,885,211 | A | 12/1989 | Tang et al. ................. 428/457 |
|---|---|---|---|
| 5,047,687 | A | 9/1991 | VanSlyke .................... 313/503 |
| 5,429,884 | A | 7/1995 | Namiki et al. .............. 428/690 |
| 2005/0168137 | A1 * | 8/2005 | Adamovich et al. ......... 313/504 |
| 2005/0212411 | A1 * | 9/2005 | Tsuchiya et al. ............ 313/504 |
| 2005/0233232 | A1 * | 10/2005 | Radu et al. ................. 430/59.1 |
| 2006/0066231 | A1 * | 3/2006 | Nishikawa et al. .......... 313/506 |
| 2006/0119255 | A1 * | 6/2006 | Kimura ...................... 313/504 |
| 2006/0181200 | A1 * | 8/2006 | Hung ......................... 313/504 |
| 2006/0202166 | A1 * | 9/2006 | Suzuki et al. .......... 252/301.16 |

FOREIGN PATENT DOCUMENTS

| TW | 432898 | 5/2001 |
|---|---|---|
| TW | 439393 | 6/2001 |
| TW | 488185 | 5/2002 |
| TW | 544955 | 8/2003 |

* cited by examiner

*Primary Examiner*—Karabi Guharay
(74) *Attorney, Agent, or Firm*—Thomas, Kayden, Horstemeyer & Risley

(57) ABSTRACT

An organic electroluminescent device (OELD) and a display incorporating the same are provided. The OELD includes an anode, a cathode, an emissive layer, a hole source and an electron source. The emissive layer is disposed between the anode and the cathode. The hole source is disposed between the anode and the emissive layer. The electron source is disposed between the cathode and the emissive layer. The electron source is made from at least an organic material and at least a salt. The salt in the electron source has a concentration with a spatial distribution such that the concentration of the salt in the part of the electron source adjacent to the cathode is higher than the concentration of the salt in another part of the electron source adjacent to the emissive layer.

21 Claims, 4 Drawing Sheets

ORGANIC ELECTROLUMINESCENT DEVICE AND DISPLAY INCORPORATING THE SAME

This application claims the benefit of Taiwan application Serial No. 94127223, filed Aug. 10, 2005, the subject matter of which is incorporated herein by reference.

BACKGROUND OF THE INVENTION

1. Field of the Invention

The present invention relates in general to an organic electroluminescent device (OELD) and a display incorporating the same, and more particularly, to an organic electroluminescent device whose salt in the electron source has a concentration with a spatial distribution and a display incorporating the same.

2. Description of the Related Art

With respect to the development of an organic electroluminescent device (OELD), the material of the cathode must be a low work function metal with high activity, so in early stage, the metal alloy of magnesium and less silver substantially in the ratio of 10:1 is used as an excellent cathode alloy. However, a highly active metal is not applicable to the OELD manufacturing process, so an inactive metal, such as aluminum (Al) for instance, is used as an electron injection electrode. However, the work function of the inactive metal can not match with the energy level of the lowest unoccupied molecular orbital (LUMO) of an organic layer. In practical application, there is a need to insert a thin layer of salt, such as lithium fluoride (LiF) for instance, between aluminum (Al) and the organic layer. Thus, tunneling effect is activated due to the insulating characteristic of LiF, so that the electron injection efficiency is largely enhanced, and that the unmatching problem of the work function of inactive metal is resolved.

With regard to the development of electron transport layer, the most effective practice is to dope a highly active metal such as lithium (Li) or cesium (Cs) to an organic electron transport material, so that radical anions and charge transfer (CT) complexes can be formed. Therefore, the operating voltages of the OELD are reduced significantly. The conductivity of the metal organic thin film doped with lithium (Li) is about $3*10^{-5}$ (S/cm), which means the inside carrier density can be as high as $10^{18}$ (cm$^{-3}$). Since an alkali metal (I A) or an alkaline metal (II A) such as cesium (Cs), lithium (Li), and magnesium (Mg) has high activity and is very sensitive in terms of metal doping, a small amount of deviation will lead to a significant change in luminance efficiency and operating lifespan of the OELD. Therefore, the alkali metal (I A) and the alkaline metal (II A) are not applicable to the heat evaporation manufacturing process during the manufacturing process of OELD. Moreover, the metallic ions of a doped layer, when driven by a current, will be spread over and activate luminance quenching effect in the organic emissive layer, causing the luminance efficiency and operating lifespan of OELD to be reduced.

SUMMARY OF THE INVENTION

It is therefore an object of the present invention to provide an organic electroluminescent device (OELD) and a display incorporating the same. With the design that the salt in the electron source has a concentration with a spatial distribution such that the concentration of the salt in the part of the electron source adjacent to the cathode is higher than the concentration of the salt in another part of the electron source adjacent to the emissive layer. Thus, the electron injection efficiency and electron transport ability of the electron source are enhanced, the operating voltage of OELD is reduced, and the operating lifespan of OELD is prolonged.

The present invention achieves the above-identified object by providing an organic electroluminescent device including an anode, a cathode, an emissive layer, a hole source and an electron source. The emissive layer is disposed between the anode and the cathode. The hole source is disposed between the anode and the emissive layer. The electron source disposed between the cathode and the emissive layer is made from at least an organic material and at least a salt. The salt in the electron source has a concentration with a spatial distribution such that the concentration of the salt in the part of the electron source adjacent to the cathode is higher than the concentration of the salt in another part of the electron source adjacent to the emissive layer.

The present invention achieves the above-identified object by providing another display including a substrate and an organic electroluminescent device. The organic electroluminescent device disposed on the substrate includes an anode, a cathode, an emissive layer, a hole source and an electron source. The emissive layer is disposed between the anode and the cathode. The hole source is disposed between the anode and the emissive layer. The electron source disposed between the cathode and the emissive layer is made from at least an organic material and at least a salt. The salt in the electron source has a concentration with a spatial distribution such that the concentration of the salt in the part of the electron source adjacent to the cathode is higher than the concentration of the salt in another part of the electron source adjacent to the emissive layer.

Other objects, features, and advantages of the present invention will become apparent from the following detailed description of the preferred but non-limiting embodiments. The following description is made with reference to the accompanying drawings.

DETAILED DESCRIPTION OF THE INVENTION

First Embodiment

Figure 1:
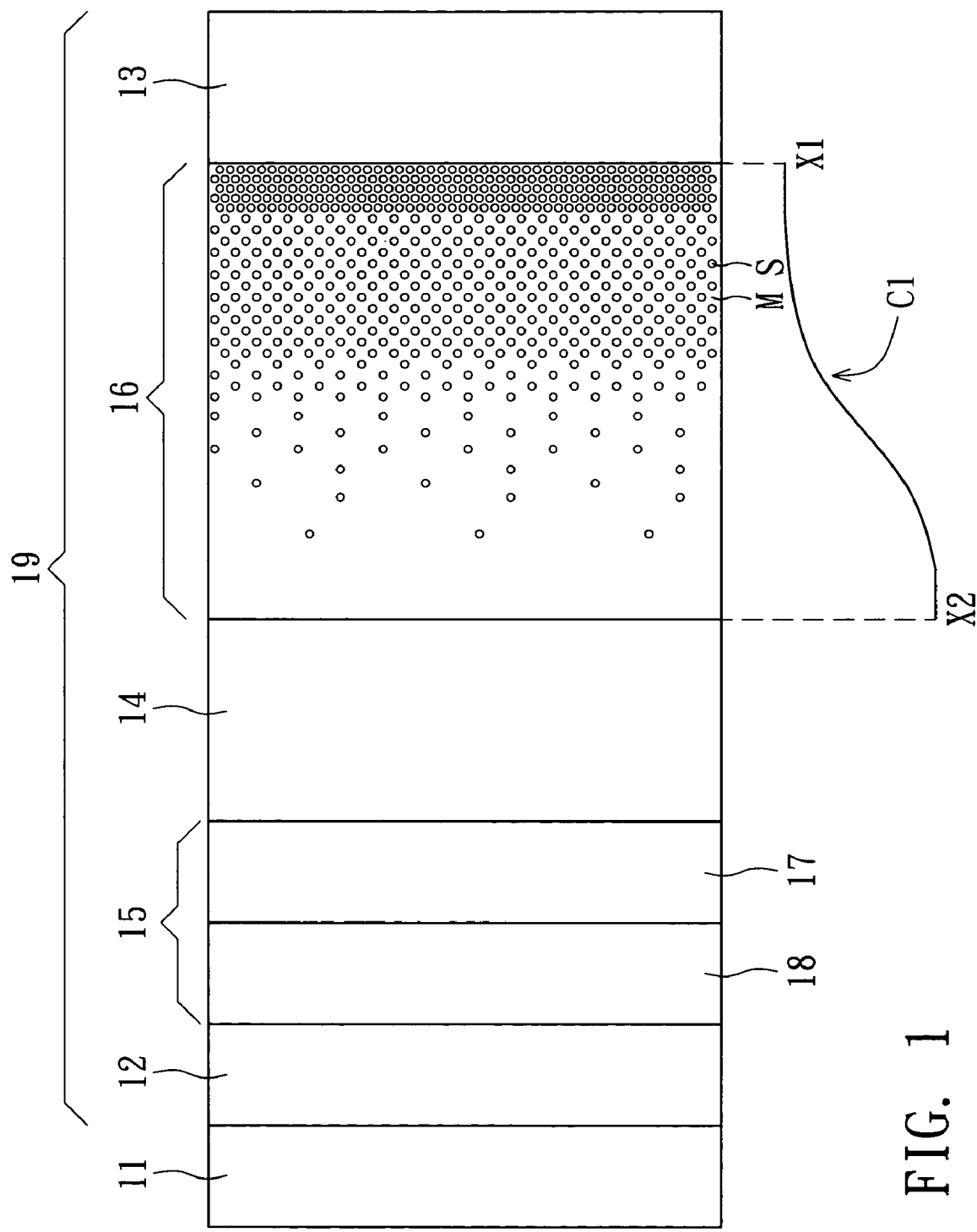
FIG. 1 is a cross-sectional view of a display incorporating an organic electroluminescent device (OELD) according to a first embodiment of the present invention.

Referring to FIG. 1, a cross-sectional view of a display incorporating an organic electroluminescent device (OELD) according to a first embodiment of the present invention is shown. In FIG. 1, the display 10 includes a substrate 11 and an organic electroluminescent device 19. The organic electroluminescent device 19 disposed on the substrate 11 includes an anode 12, a cathode 13, an emissive layer 14, a hole source 15 and an electron source 16. The organic electroluminescent device 19 is exemplified by the anode 12 disposed on the substrate 11, however the technology of the present embodiment of the invention is not limited thereto. For example, in the organic electroluminescent device 19, the cathode 13 is disposed on the substrate 11. The emissive layer 14 is disposed between the anode 12 and the cathode 13, and the hole source 15 is disposed between the anode 12 and the emissive layer 14. The electron source 16 is disposed between the cathode 13 and the emissive layer 14. The electron source 16 is made from at least an organic material M and at least a salt S. The salt S in the electron source 16 has a concentration with a spatial distribution C1, such that the concentration X1 of the salt S in the part of the electron source 16 adjacent to the cathode 13 is higher than the concentration X2 of the salt S in the part of the electron source 16 adjacent to the emissive layer 14. Thus, the electron injection efficiency and electron transport ability of the electron source 16 are enhanced, the operating voltage of the organic electroluminescent device 19 is reduced, and the operating lifespan of the organic electroluminescent device 19 is prolonged.

In the present embodiment of the invention, the electron source 16 is a single-layered structure. Moreover, the hole source 15 further includes a hole transport layer 17 and a hole injection layer 18. The hole transport layer 17 is disposed between the anode 11 and the emissive layer 14, while the hole injection layer 18 is disposed between hole transport layer 17 and the anode 11. In one embodiment, the hole source 15 only includes the hole transport layer 17.

When X1 and X2 are substantially and respectively equal to 100 wt % and 0 wt %, a small part of the electron source 16 adjacent to the cathode 13 is made from the salt S only but not any organic material M, while another small part of the electron source 16 adjacent to the emissive layer 14 is made from the organic material M only but not any salt S. Moreover, the other parts of the electron source 16 are made from the organic material M and the salt S. When X1 is substantially equal to 100 wt %, X2 substantially can be other than 0 wt %. Moreover, when X2 is substantially equal to 0 wt %, X1 substantially can be other than 100 wt %.

However, anyone who is skilled in the technology field of the present embodiment of the invention would understand that the technology of the present embodiment of the invention is not limited thereto. For example, the salt S includes an organic metallic salt or an inorganic metallic salt. Moreover, the salt S includes an alkali metal (IA) salt or an alkaline metal (IIA) salt. Moreover, when the salt S is an inorganic metallic salt, the salt S can include sodium chloride (NaCl), lithium fluoride (LiF), cesium fluoride (CsF), lithium oxide ($Li_2O$), barium fluoride ($BaF_2$), strontium fluoride ($CrF_2$), magnesium fluoride ($MgF_2$), calcium fluoride ($CaF_2$), or calcium oxide (CaO). That is, the salt S is selected from the group consisting of NaCl, LiF, CsF, $Li_2O$, $BaF_2$, $CrF_2$, $MgF_2$, $CaF_2$, CaO and the combination thereof. Besides, when the salt S is an organic metallic salt, the salt S can include alkyl lithium, cesium carbonate ($CsCO_3$), cesium acetate ($H_3COOCs$), potassium acetate ($H_3COOK$), or sodium acetate ($H^3COONa$). That is, the salt S is selected from the group consisting of alkyl lithium, $CsCO_3$, $H_3COOCs$, $H_3COOK$, $H_3COONa$ and the combination thereof. Furthermore, the atomic number of the metal of the salt S can be larger than or equal to 19, while the salt S includes CsF, $BaF_2$, $MgF_2$, $CrF_2$, $CaF_2$, $H_3COOCs$, $H_3COOK$, or $CsCO_3$. That is, the salt S is selected from the group consisting of CsF, $BaF_2$, $MgF_2$, $CrF_2$, $CaF_2$, $H_3COOCs$, $H_3COOK$, $CsCO_3$ and the combination thereof.

The operation and functions of the organic material M are disclosed below. The organic material M is adapted for transporting electrons, while the electronic mobility of the organic material M is substantially larger than $10^{-6}(cm^2 NS)$. Moreover, the organic material M is adapted for transporting electrons and holes, while the electron mobility and the hole mobility of the organic material M are both substantially larger than $10^{-6}(cm^2 NS)$. OK It is noteworthy given that the salt S in the electron source 16 has the concentration with the spatial distribution C1 and that the concentration X1 of the salt S in the part of the electron source 16 adjacent to the cathode 13 is higher than the concentration X2 of the salt S in the part of the electron source 16 adjacent to the emissive layer 14, the electron source 16 can only be made from an organic material and a salt. Moreover, the electron source 16 can be made from an organic material and a variety of salts. Besides, the electron source 16 can be made from a variety of organic materials and a salt. Furthermore, the electron source 16 can be made from a variety of organic materials and a variety of salts.

The anode 12 and the cathode 13 disclosed above include metal, metallic alloy, or transparent conductive material, and at least either of the anode 12 and the cathode 13 is a transparent or semi-transparent electrode. The transparent conductive material includes a transparent metallic oxide such as indium tin oxide (ITO), indium zinc oxide (IZO), cadmium tin oxide (CTO), stannic dioxide ($SnO_2$), zinc oxide (ZnO), or like as. The metal and the metallic alloy include aurum (Au), silver (Ag), aluminum (Al), indium (In), magnesium, (Mg), calcium (Ca), or like as. The cathode 13 can be a conductor whose electrical conductivity is larger than 100, a metal whose work function is below 4.2 electronic volts (eV), or a metallic alloy doped with a metal whose work function equals 4.2 (eV).

When only the anode 12 is transparent or semi-transparent, the cathode 13 can be a reflective metal, the organic electroluminescent device 19 is a bottom emissive device, while the substrate 11 must be a transparent or semi-transparent substrate. When only the cathode 13 is transparent or semi-transparent, the anode 12 can be a reflective metal, the organic electroluminescent device 19 is a top emissive device, while the substrate 11 can be a transparent, semi-transparent or opaque substrate. When both of the anode 12 and the cathode 13 are transparent or semi-transparent, the organic electroluminescent device 19 is a dual emissive device, while the substrate 11 must be a transparent or semi-transparent substrate.

The display 10 of the present embodiment of the invention can be applied in electronic products such as computer monitor; flat TV, monitor, pocket PC TV, mobile phone, handheld game device, digital camera (DC), digital video (DV), digital audio device, personal digital assistant (PDA), webpad, notebook, palm-top computer, lap-top computer, Table PC, portable video device, video camera, portable information terminal device, digital video disc player, projector, or like as.

In the present embodiment of the invention, the electron source 16 is made from an organic material having electron transportation ability doped with an IA or a IIA salt whose atomic number is larger than 17. Now the IA or the IIA salt is no longer as active as in the metal state, and no more have the difficulties encountered when applied in practical manufacturing process as would occur in prior arts. Moreover, the characteristic of the electron source 16 is between pure salt single layer and pure organic single layer, and can integrate the heterogeneous interfaces between the salt and the organic material. Besides, when atomic number of the metal of the salt S in the electron source 16 is larger than or equal to 17, the ionic bonds formed between the metallic ions and the anions become weaker because the metallic ions have larger sizes. The effect produced when the salt is doped in the electron source 16 is similar to the effect produced when the pure metallic ions are doped in the conventional electron transport layer, the electrical conductivity and electron transport of the organic material are largely enhanced. On the contrary, when the atomic number of the metal of the salt is smaller than 17, the metal is difficult to be ionized to form a metallic ion because the ion bond formed between the metal of the salt and the anion is too strong. However, the present embodiment of the invention is not limited thereto.

It can be seen from the above disclosure that the electron source 16 of the present embodiment of the invention has excellent electron injection efficiency and electron transport ability of electrons, thus improving many disadvantages encountered in prior arts.

Second Embodiment

Figure 2:
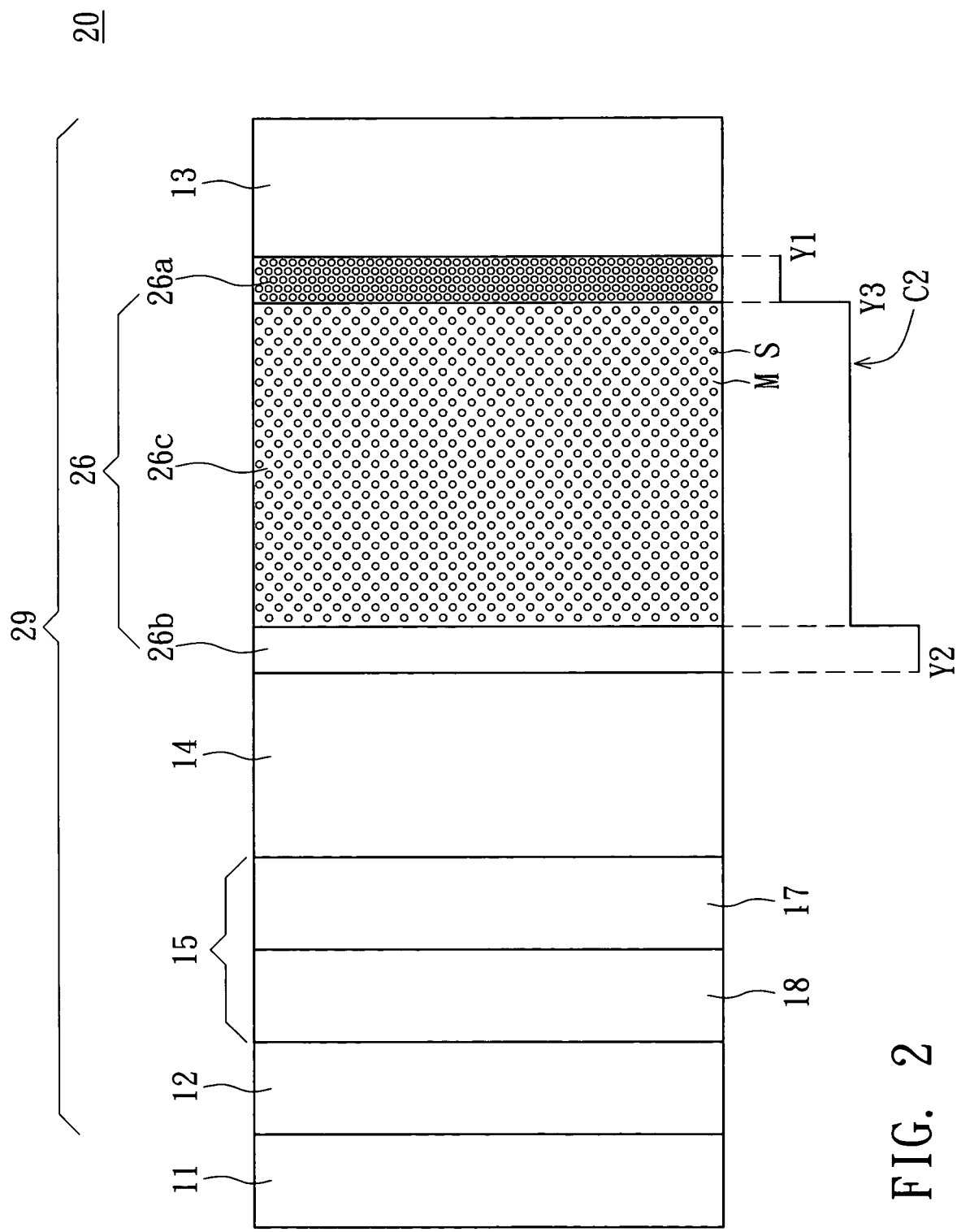
FIG. 2 is a cross-sectional view of a display incorporating an organic electroluminescent device according to a second embodiment of the present invention.

Referring to FIG. 2, a cross-sectional view of a display incorporating an organic electroluminescent device according to a second embodiment of the present invention is shown. The display 20 of the present embodiment differs with the display 10 of the first embodiment in the organic electroluminescent device 29, while the organic electroluminescent device 29 of the present embodiment differs with the organic electroluminescent device 19 of the first embodiment in the electron source 26. As for the same components, the same labels are used and their relationships are not repeated here.

In FIG. 2, the electron source 26 is disposed between the cathode 13 and the emissive layer 14. The electron source 26 is made from at least an organic material M and at least a salt S. The salt S in the electron source 26 has a concentration with a spatial distribution C2 such that the concentration Y1 of the salt S in the part of the electron source 16 adjacent to the cathode 13 is higher than the concentration Y2 of the salt S in another part of the electron source 26 adjacent to the emissive layer 14. Thus, the electron injection efficiency and electron transport ability of the electron source 26 are enhanced, the operating voltage of the organic electroluminescent device 29 is reduced, and the operating lifespan of the organic electroluminescent device 29 is prolonged.

In the present embodiment of the invention, the electron source 26 includes at least a first layer 26a, at least a second layer 26b and at least a third layer 26c. The first layer 26a and the second layer 26b are respectively adjacent to the cathode 13 and the emissive layer 14. The concentration Y1 of the salt S in first layer 26a is higher than the concentration Y2 of the salt S in the second layer 26b. The third layer 26c is disposed between the first layer 26a and the second layer 26b. The concentration Y3 of the salt S in the third layer 26c ranges between the concentration Y1 of the salt S in the first layer 26a and the concentration Y2 of the salt S in the second layer 26b.

When Y1 and Y2 are substantially and respectively equal to 100 wt % and 0 wt %, the first layer 26a is made from the salt S only but not any organic material M, while the second layer 26b is made from the organic material M only but not any salt S. Moreover, the third layer 26c is made from the organic material M and the salt S. The concentration Y3 of the salt S in the third layer 26c substantially ranges between 0 wt % and 100 wt %. When Y1 is substantially equal to 100 wt %, Y2 substantially can be other than 0 wt %. Moreover, when Y2 is substantially equal to 0 wt %, Y1 substantially can be other than 100 wt %.

However, anyone who is skilled in the technology filed of the present embodiment of the invention would understand that the technology of the present embodiment of the invention is not limited thereto. When Y1 and Y2 are substantially not equal to 100 wt % and 0 wt % respectively, the first layer 26a, the second layer 26b and the third layer 26c can be made from an organic material and a salt. Moreover, the first layer 26a, the second layer 26b and the third layer 26c can be made from an organic material and a variety of salts. Besides, the first layer 26a, the second layer 26b and the third layer 26c can be made from a variety of organic materials and a salt. Furthermore, the first layer 26a, the second layer 26b and the third layer 26c can be made from a variety of organic materials and a variety of salts. The salts in the first layer 26a, the second layer 26b and the third layer 26c can be the same or different. The organic materials of the first layer 26a, the second layer 26b and the third layer 26c can be the same or different.

When Y1 and Y2 are substantially and respectively equal to 100 wt % and 0 wt %, the first layer 26a can be made from one or a variety of salts, the second layer 26b can be made from one or a variety of organic materials. Moreover, the third layer 26c can be made from an organic material and a variety of salts. Besides, the third layer 26c can be made from a variety of organic materials and a salt. Furthermore, the third layer 26c can be made from a variety of organic materials and a variety of salts. The salts in the first layer 26a and third layer 26c can be the same or different. The organic materials of the second layer 26b and the third layer 26c can be the same or different.

Although the present embodiment of the invention is exemplified by setting the concentration Y3 of the salt S in the third layer 26c to be ranging between the concentration Y1 of the salt S in the first layer 26a and the concentration Y2 of the salt S in the second layer 26b, however, the technology of the present embodiment of the invention is not limited thereto. For example, the concentration Y3 of the salt S in the third layer 26c can be equal to the concentration Y1 of the salt S in the first layer 26a but higher than the concentration Y2 of the salt S in the second layer 26b. Or, the concentration Y3 of the salt S in the third layer 26c can be equal to the concentration Y2 of the salt S in the second layer 26b but lower than the concentration Y1 of the salt S in the first layer 26a.

Third Embodiment

Figure 3:
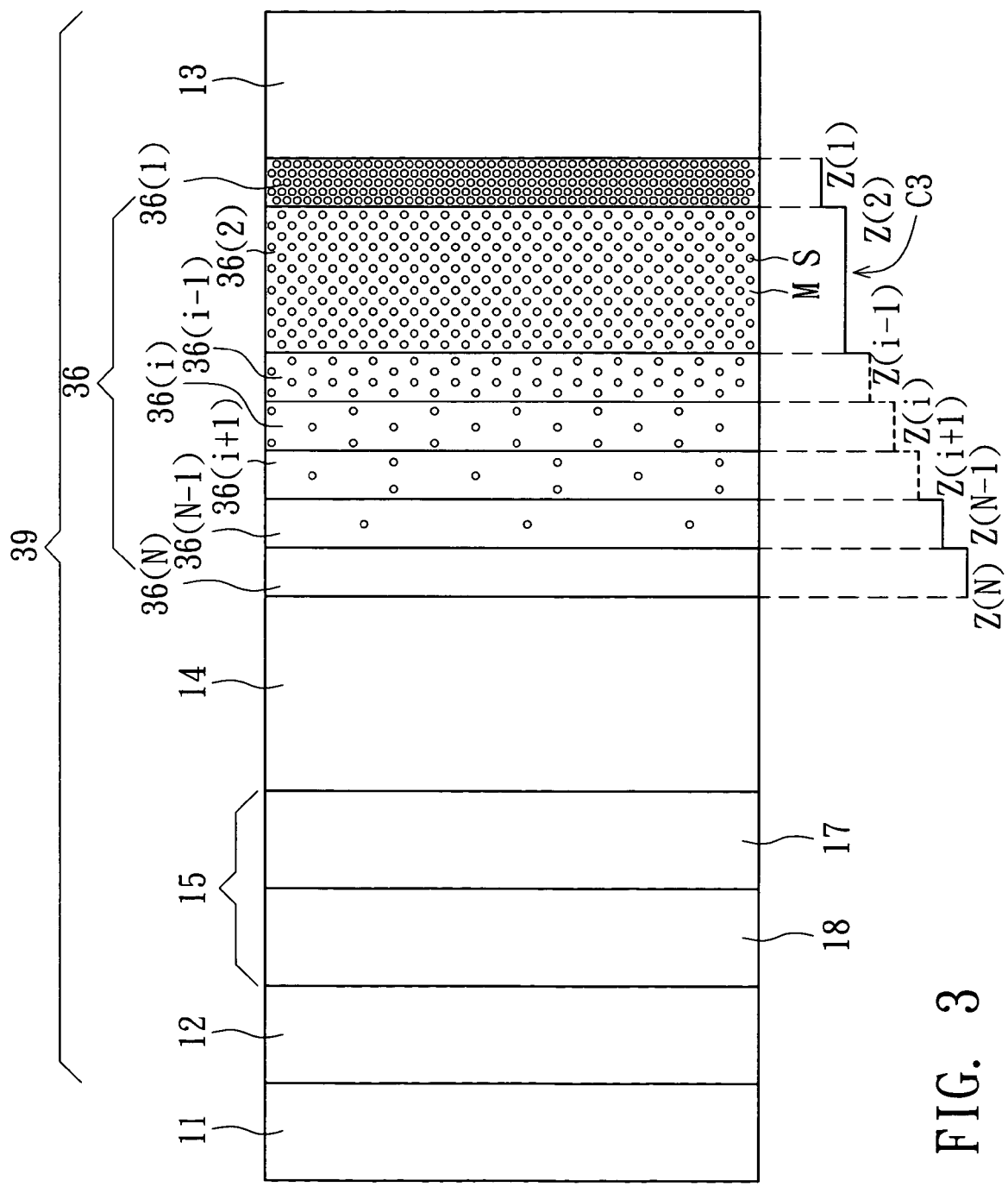
FIG. 3 is a cross-sectional view of a display incorporating an organic electroluminescent device according to a third embodiment of the present invention.

Referring to FIG. 3, a cross-sectional view of a display incorporating an organic electroluminescent device according to a third embodiment of the present invention is shown. The display 30 of the present embodiment differs with the display 20 of the second embodiment in the organic electroluminescent device 39, while the organic electroluminescent device 39 of the present embodiment differs with the organic electroluminescent device 29 of the second embodiment in the electron source 36. As for the same components, the same labels are used and their relationships are not repeated here.

In FIG. 3, the electron source 36 is disposed between the cathode 13 and the emissive layer 14. The electron source 36 includes at least an organic material M and at least a salt S. The salt S in the electron source 36 has a concentration with a spatial distribution C3 such that the concentration of the salt S in the electron source 36 adjacent to the cathode 13 is higher than the concentration of the salt S in the electron source 36 adjacent to the emissive layer 14. Thus, the electron injection efficiency and electron transport ability of the electron source 36 are enhanced, the operating voltage of the organic electroluminescent device 39 is reduced, and the operating lifespan of the organic electroluminescent device 39 is prolonged.

In the present embodiment, the electron source 36 includes a plurality of layers, the concentration of the salt S in the layers diminishes from high concentration in the layer adjacent to the cathode 13 towards low concentration in the layer adjacent to the emissive layer 14. For example, the concentration of the salt S diminishes from the layer of the plurality of layers adjacent to the cathode 13 towards the layer of the plurality of layers adjacent to emissive layer 14 layer by layer. Moreover, in the electron source 36, apart from the two layers adjacent to the cathode 13 and the emissive layer 14 respectively, the salt S can have the same concentration in any two of the remaining layers whatever adjacent to each other or not.

Suppose that the electron source 36 includes N layers, namely layers 36(1)~36(N), where N is a positive integer larger than 3. The layers 36(1) and 36(N) are respectively adjacent to the cathode 13 and the emissive layer 14, the concentration of the salt S in the layer 36(1) is Z(1), that is, the concentration of the salt S in the electron source 36 adjacent to the cathode 13. The concentration of the salt S in the layer 36(N) is Z(N), that is, the concentration of the salt S in the electron source 36 adjacent to the emissive layer 14. Therefore, the concentration Z(1) of the salt S in the electron source 36 adjacent to the cathode 13 is higher than the concentration Z(N) of the salt S in the electron source 36 adjacent to the emissive layer 14. The layer 36($i$) is disposed between the layers 36($i$−1) and 36($i$+1), where the value of i ranges from 2~N−1. The concentration Z(i) of the salt S in the layer 36($i$) is lower than the concentration Z(i−1) of the salt S in the layer 36($i$−1) but is higher than the concentration Z(i+1) of salt S in the layer 36($i$+1). The concentration Z(2) of the salt S in the layer 36(2) can be lower than or equal to the concentration Z(1) of the salt S in the layer 36(1), while the concentration Z(N−1) of the salt S in the layer 36(N−1) can be higher than or equal to the concentration Z(N) of the salt S in the layer 36(N).

When Z(1) and Z(N) are substantially and respectively equal to 100 wt % and 0 wt %, the layer 36(1) is made from includes the salt S doped only but not any organic material M. The layer 36(N) is made from the organic material M only but not any salt S. Moreover, the layer 36($i$) is made from the organic material M and the salt S. When Z(1) is substantially equal to 100 wt %, Z(N) substantially can be other than 0 wt %, and when Z(N) is substantially equal to 0 wt %, Z(1) substantially can be other than 100 wt %.

However, anyone who is skilled in the technology field of the present embodiment of the invention would understand that the technology of the present embodiment of the invention is not limited thereto. For example, when Z(1) and Z(N) are substantially but not respectively not equal to 100 wt % and 0 wt %, the layers 36(1)-36(N) can be made from an organic material and a salt. Moreover, the layers 36(1)~36(N) can be made from an organic material and a variety of salts. Besides, the layers 36(1)~36(N) can be made from a variety of organic materials and a salt. Furthermore, the layers 36(1)~36(N) can be made from a variety of organic materials and a variety of salts. The salts in each of the layers 36(1)~36(N) can be the same or different, while the organic materials in each of the layers 36(1)~36(N) can be the same or different.

When Z(1) and Z(N) are substantially and respectively equal to 100 wt % and 0 wt %, the layer 36(1) can be made from one or a variety of salts, while the layer 36(N) can be made from one or a variety of organic materials. Moreover, the layer 36($i$) can be made from an organic material and a variety of salts, where the value of i ranges from 2~N−1. Besides, the layer 36($i$) can be made from a variety of organic materials and a salt, where the value of i ranges from 2~N−1. Furthermore, the layer 36($i$) can be made from a variety of organic materials and a variety of salts, where the value of i ranges from 2~N−1. The salts in the layers 36(1) and 36($i$) can be the same or different, while the organic material of the layers 36(N) and 36($i$) can be the same or different, where the value of i ranges from 2~N−1.

As for the electron injection efficiency and electron transport ability of the electron source disclosed in above embodiments are exemplified by the electron source 16 of the OELD 19 here, and devices such as the red (R) device, the green (G) device and the blue (B) device are manufactured accordingly. Moreover, the curves showing the relationships between the operating voltage and luminance for RGB devices of the present embodiment of the invention are compared against the curves showing the relationships between the operating voltage and luminance for RGB devices of a comparison example. In the present embodiment of the present invention, the RGB devices of the present embodiment respectively use the composite cathode of indium tin oxide (ITO), LiF (LiF) and aluminum (Al) as the anode 12 and the cathode 13, and respectively use CsF and Dinaphthyl anthrathene (ADN) as the salt S and the organic material M to form the electron source 16. The RGB emissive materials are respectively used as the emissive layers for the red device, the green device and the blue device in the present embodiment and the comparison example. Cesium is an IA metal whose atomic number is 55. The doping concentration of CsF in the electron source 16 is substantially equal to 20 wt %. ADN is an organic material capable of transporting both the electron and the hole. Moreover, RGB devices of the comparison example differ with the RGB devices of the present embodiment in the electron source. The electron sources of the devices of the comparison example only use conventional organic material as the electron transport layer, such as 8-tris-hydroxyquinoline aluminum ($Alq_3$) for instance. Various operating voltages are applied to the RGB devices of the present embodiment and the comparison example, while the luminances of the RGB devices of the present embodiment and the comparison example under various operating voltages are observed.

Figures 4A, 4B, 4C:
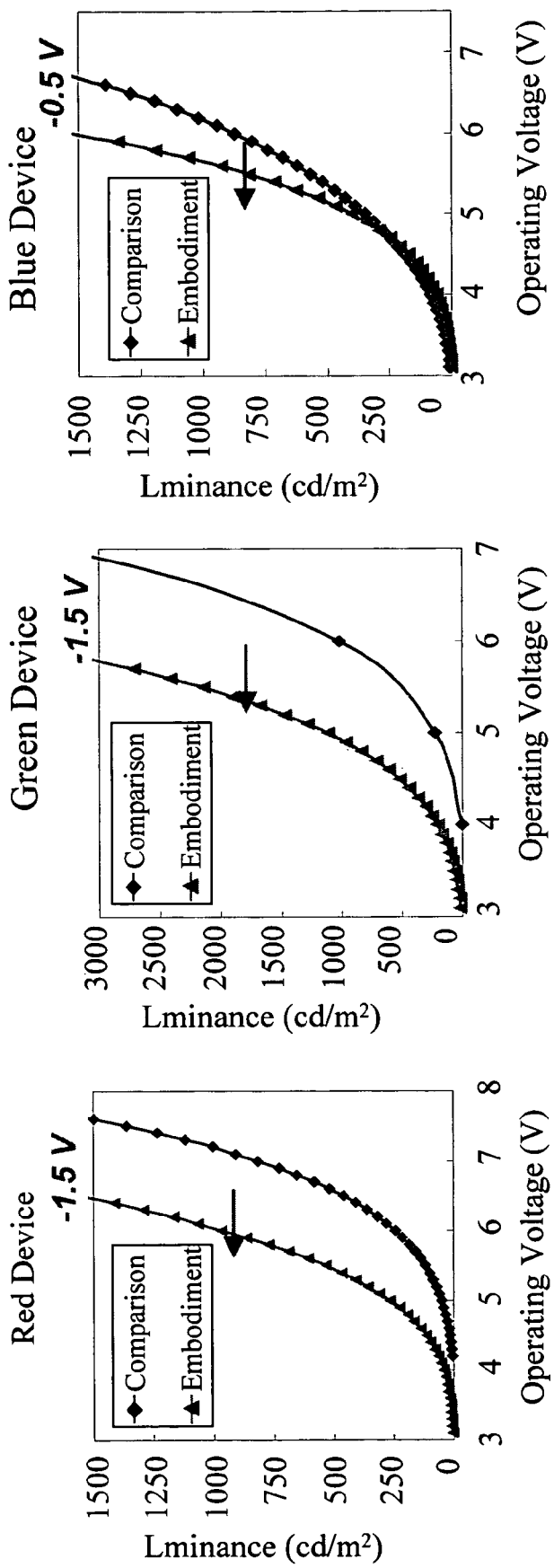
FIGS. 4A~4C are diagrams comparing the curves showing the relationship between operating voltages and luminances of the present embodiment against the curves showing the relationship between operating voltages and luminances of the comparison example for the red (R), the green (G) and the blue (B) devices respectively.

Referring to FIGS. 4A~4C, diagrams comparing the curves showing the relationship between operating voltages and luminances of the present embodiment against the curves showing the relationship between operating voltages and luminances of the comparison example for the red (R), the green (G) and the blue (B) devices respectively are shown. It can be seen from FIGS. 4A~4C that when the operating voltage ranges between 3~6 volts (V), if the same operating voltage is applied to the RGB devices of the present embodiment and the RGB devices of the comparison example, the RGB devices of the present embodiment correspondingly produce higher luminances than the RGB devices of the comparison example would do. In other words, for the RGB devices of the present embodiment to produce the same luminances with the RGB devices of the comparison example, the RGB devices of the present embodiment require lower operating voltage than the RGB devices of the comparison example would do. Therefore, the electron source 16 of the present embodiment really has better electron injection efficiency and electron transport ability than the electron transport layer of the comparison example would have. Furthermore, after adopting the electron source 16, the RGB devices of present embodiment can largely reduce the required operating voltages. The electron source 26 and the electron source 36 both have excellent electron injection efficiency and electron transport ability, and after the organic electroluminescent device 29 and the organic electroluminescent device 39 respectively adopt the electron source 26 and the electron source 36, the required operating voltages can also be largely reduced.

Regardless of the red device, the green device or the blue device, the relationship curves between the operating voltages and the luminances for RGB devices of the present embodiment are more leftward than the relationship curves between the operating voltages and the luminances for RGB devices of the comparison example. This means that after adopting the electron sources 16 of the present embodiment, the operating voltages of the RGB devices in the present embodiment are all reduced.

The organic electroluminescent device and a display incorporating the same disclosed in the above embodiments of the invention has the design that the salt in the electron source has a concentration with a spatial distribution such that the concentration of the salt in the part of the electron source adjacent to the cathode is higher than the concentration of the salt in another part of the electron source adjacent to the emissive layer. Thus, the electron injection efficiency and electron transport ability of the electron source are enhanced, the operating voltage of the OLED is reduced, and the operating lifespan of OLED is prolonged.

Although the above embodiments of the present invention are exemplified by the application of the electron source in the organic electroluminescent device, the electron source disclosed in above embodiments can also be applied to other electronic products having the functions of electron injection and transport.

While the present invention has been described by way of example and in terms of a preferred embodiment, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic electroluminescent device (OELD), comprising:
    an anode and a cathode;
    an emissive layer disposed between the anode and the cathode;
    a hole source disposed between the anode and the emissive layer; and
    an electron source comprising a mixture of at least an organic material and at least a salt, and the electron source disposed between the cathode and the emissive layer, wherein the salt concentration distribution in the electron source is increasingly varied with position closer to the cathode, such that the concentration of the salt in the part of the electron source adjacent to the cathode is higher than the concentration of the salt in another part of the electron source adjacent to the emissive layer.

2. The OELD of claim 1, wherein the salt comprises an organic metallic salt or an inorganic metallic salt.

3. The OELD of claim 2, wherein the salt comprises an alkali metal (IA) salt or an alkaline metal (IIA) salt.

4. The OELD of claim 2, wherein the inorganic metallic salt comprises sodium chloride, lithium fluoride, cesium fluoride, lithium oxide, barium fluoride, strontium fluoride, magnesium fluoride, calcium fluoride, or calcium oxide.

5. The OELD of claim 2, wherein the organic metallic salt comprises alkyl lithium, cesium carbonate, cesium acetate, potassium acetate, or sodium acetate.

6. The OELD of claim 2, wherein the atomic number of the metal of the salt is larger than or equal to 19.

7. The OELD of claim 6, wherein the salt comprises cesium fluoride, barium fluoride, magnesium fluoride, strontium fluoride, calcium fluoride, cesium acetate, potassium acetate, or cesium carbonate.

8. The OELD of claim 1, wherein the organic material is adapted for transporting electrons, and the organic material has an electronic mobility substantially larger than $10^{-6}(cm^2/VS)$.

9. The OELD of claim 1, wherein the organic material is adapted for transporting electrons and holes, and the electron mobility and the hole mobility of the organic material are both substantially larger than $10^{-6}(cm^2/VS)$.

10. The OELD of claim 1, wherein the hole source comprises a hole transport layer and a hole injection layer.

11. The OELD of claim 1, wherein the electron source comprises:
    at least a first layer and at least a second layer adjacent to the cathode and the emissive layer, respectively, wherein the concentration of the salt in the first layer is higher than the concentration of the salt in the second layer; and
    at least a third layer disposed between the first layer and the second layer, wherein the concentration of the salt in the third layer ranges between the concentration of the salt in the first layer and the concentration of the salt in the second layer.

12. The OELD of claim 1, wherein the electron source comprises a plurality of layers, one of the plurality of layers adjacent to the cathode is made from the salt, and the concentration of the salt diminishes towards another layer of the plurality of layers adjacent to the emissive layer from the layer adjacent to the cathode.

13. A display, comprising:
    a substrate; and
    an organic electroluminescent device (OELD) disposed on the substrate, comprising:
        an anode and a cathode;
        an emissive layer disposed between the anode and the cathode;
        a hole source disposed between the anode and the emissive layer; and
        an electron source comprising a mixture of at least an organic material and at least a salt, and the electron source disposed between the cathode and the emissive layer further comprising:
            at least a first layer and at least a second layer adjacent to the cathode and the emissive layer, respectively, wherein the concentration of the salt in the first layer is higher than the concentration of the salt in the second layer; and
            at least a third layer disposed between the first layer and the second layer, wherein the concentration of the salt in the third layer ranges between the concentration of the salt in the first layer and the concentration of the salt in the second layer.

14. The display of claim 13, wherein the salt comprises an organic metallic salt or an inorganic metallic salt.

15. The display of claim 14, wherein the salt is an alkali metal (IA) salt or an alkaline metal (IIA) salt.

16. The display of claim 14, wherein the atomic number of the metal of the salt is larger than or equal to 19.

17. The display of claim 16, wherein the salt comprises cesium fluoride, barium fluoride, magnesium fluoride, strontium fluoride, calcium fluoride, cesium acetate, potassium acetate, or cesium carbonate.

18. The display of claim 13, wherein the organic material is adapted for transporting an electron, and the organic material has an electronic mobility substantially larger than $10^{-6} (cm^2/VS)$.

19. The display of claim 13, wherein the organic material is adapted for transporting electrons and holes, and the electron mobility and the hole mobility of the organic material are both substantially larger than $10^{-6} (cm^2/VS)$.

20. The display of claim 13, wherein the hole source comprises a hole transport layer and a hole injection layer.

21. The display of claim 13, wherein the electron source comprises a plurality of layer, one of the plurality of layers adjacent to the cathode is made from the salt, and the concentration of the salt diminishes towards another layer of the plurality of layers adjacent to the emissive layer from the layer adjacent to the cathode.

\* \* \* \* \*